(12) United States Patent
Yasuda et al.

(10) Patent No.: US 12,525,494 B2
(45) Date of Patent: Jan. 13, 2026

(54) COMPOSITED CARRIER FOR MICROPHONE PACKAGE

(71) Applicant: Skyworks Solutions, Inc., Irvine, CA (US)

(72) Inventors: Takanori Yasuda, Nara (JP); Siarhei Dmitrievich Barsukou, Takarazuka (JP); Keiichi Maki, Suita (JP); Hiroyuki Nakamura, Osaka-Fu (JP)

(73) Assignee: Skyworks Solutions, Inc., Irvine, CA (US)

( * ) Notice: Subject to any disclaimer, the term of this patent is extended or adjusted under 35 U.S.C. 154(b) by 241 days.

(21) Appl. No.: 18/190,338

(22) Filed: Mar. 27, 2023

(65) Prior Publication Data
US 2023/0345648 A1 Oct. 26, 2023

Related U.S. Application Data

(60) Provisional application No. 63/325,409, filed on Mar. 30, 2022, provisional application No. 63/325,433, (Continued)

(51) Int. Cl.
*H04R 17/02* (2006.01)
*B81B 7/00* (2006.01)
(Continued)

(52) U.S. Cl.
CPC ............ *H01L 23/13* (2013.01); *B81B 7/0061* (2013.01); *H01L 23/15* (2013.01); *H01L 24/32* (2013.01); *H01L 24/48* (2013.01); *H01L 25/16* (2013.01); *H05K 1/0306* (2013.01); *H05K 5/0052* (2013.01); *H05K 5/0065* (2013.01); *B81B 2207/012* (2013.01); *B81B 2207/096* (2013.01); *H01L 23/66* (2013.01); *H01L 2224/32235* (2013.01); *H01L 2224/48137* (2013.01); (Continued)

(58) Field of Classification Search
CPC ......... H01L 23/13; H01L 23/15; H01L 24/32; H01L 24/48; H01L 25/16; H01L 23/66; H01L 2224/32235; H01L 2224/48137; H01L 2224/48229; H01L 2924/1433
See application file for complete search history.

(56) References Cited

U.S. PATENT DOCUMENTS 5,973,929 A 10/1999 Arakawa et al.
5,990,762 A 11/1999 Nakamura et al.
(Continued)

FOREIGN PATENT DOCUMENTS

EP 2037700 A2 3/2009

*Primary Examiner* — Brian Ensey
(74) *Attorney, Agent, or Firm* — Knobbe, Martens, Olson & Bear, LLP (57) ABSTRACT

An integrated device package is disclosed. The integrated device package can include a carrier that has a multilayer structure having a first layer and a second layer. The first layer at least partially defines a lower side of the carrier. An electrical resistance of the second layer is greater than an electrical resistance of the first layer. The integrated device package can include a microelectronicmechanical systems die that is mounted on an upper side of the carrier opposite the lower side. The integrated device package can include a lid that is coupled to the carrier. The lid and the microelectronicmechanical systems die are spaced by a gap defining a back volume.

20 Claims, 7 Drawing Sheets

Related U.S. Application Data filed on Mar. 30, 2022, provisional application No. 63/325,414, filed on Mar. 30, 2022.

(51) Int. Cl.
*H01L 23/00* (2006.01)
*H01L 23/13* (2006.01)
*H01L 23/15* (2006.01)
*H01L 25/16* (2023.01)
*H05K 1/03* (2006.01)
*H05K 5/00* (2006.01)
*H01L 23/66* (2006.01)

(52) U.S. Cl.
CPC ............... *H01L 2224/48229* (2013.01); *H01L 2924/1433* (2013.01); *H01L 2924/1461* (2013.01); *H01L 2924/15151* (2013.01); *H01L 2924/1517* (2013.01); *H01L 2924/1616* (2013.01); *H01L 2924/16251* (2013.01); *H04R 17/02* (2013.01); *H04R 2201/003* (2013.01); *H05K 2201/068* (2013.01); *H05K 2201/10083* (2013.01)

(56) References Cited

U.S. PATENT DOCUMENTS

| | | | |
|---|---|---|---|
| 6,104,260 | A | 8/2000 | Yamada et al. |
| 6,348,845 | B2 | 2/2002 | Nakamura et al. |
| 6,351,196 | B1 | 2/2002 | Nakamura et al. |
| 6,476,691 | B1 | 11/2002 | Tsuzuki et al. |
| 6,650,206 | B2 | 11/2003 | Nakamura et al. |
| 6,674,345 | B2 | 1/2004 | Nakamura et al. |
| 6,683,515 | B1 | 1/2004 | Nakamura et al. |
| 6,710,683 | B2 | 3/2004 | Nakamura et al. |
| 6,801,100 | B2 | 10/2004 | Nakamura et al. |
| 6,806,619 | B2 | 10/2004 | Nakamura et al. |
| 6,809,611 | B2 | 10/2004 | Ishizaki et al. |
| 6,853,269 | B2 | 2/2005 | Nakamura et al. |
| 6,870,302 | B2 | 3/2005 | Nakamura et al. |
| 6,882,250 | B2 | 4/2005 | Uriu et al. |
| 6,891,450 | B2 | 5/2005 | Nakamura et al. |
| 6,900,705 | B2 | 5/2005 | Nakamura et al. |
| 6,930,570 | B2 | 8/2005 | Nakamura et al. |
| 6,972,643 | B2 | 12/2005 | Tsunekawa et al. |
| 6,975,180 | B2 | 12/2005 | Nakamura et al. |
| 7,012,480 | B2 | 3/2006 | Nakamura et al. |
| 7,019,435 | B2 | 3/2006 | Nakaya et al. |
| 7,034,634 | B2 | 4/2006 | Nakamura et al. |
| 7,034,635 | B2 | 4/2006 | Nakamura et al. |
| 7,046,102 | B2 | 5/2006 | Nakamura et al. |
| 7,075,391 | B2 | 7/2006 | Nakamura et al. |
| 7,138,890 | B2 | 11/2006 | Nakamura et al. |
| 7,176,768 | B2 | 2/2007 | Nakamura et al. |
| 7,224,240 | B2 | 5/2007 | Nakamura et al. |
| 7,301,420 | B2 | 11/2007 | Yamaguchi et al. |
| 7,446,629 | B2 | 11/2008 | Nakamura et al. |
| 7,498,898 | B2 | 3/2009 | Nakanishi et al. |
| 7,501,917 | B2 | 3/2009 | Nishimura et al. |
| 7,579,931 | B2 | 8/2009 | Nakamura et al. |
| 7,701,311 | B2 | 4/2010 | Nakamura et al. |
| 7,812,688 | B2 | 10/2010 | Nakamura et al. |
| 7,898,360 | B2 | 3/2011 | Mitani et al. |
| 7,939,988 | B2 | 5/2011 | Goto et al. |
| 7,965,155 | B2 | 6/2011 | Nakamura et al. |
| 7,982,365 | B2 | 7/2011 | Goto et al. |
| 8,035,460 | B2 | 10/2011 | Nakanishi et al. |
| 8,072,293 | B2 | 12/2011 | Nakamura et al. |
| 8,084,915 | B2 | 12/2011 | Hamaoka et al. |
| 8,084,916 | B2 | 12/2011 | Goto et al. |
| 8,154,171 | B2 | 4/2012 | Nishimura et al. |
| 8,174,165 | B2 | 5/2012 | Nakanishi et al. |
| 8,184,845 | B2 * | 5/2012 | Leidl ............ B81B 7/0061 381/369 |
| 8,330,553 | B2 | 12/2012 | Tsurunari et al. |
| 8,368,486 | B2 | 2/2013 | Tsurunari et al. |
| 8,384,495 | B2 | 2/2013 | Fujiwara et al. |
| 8,410,865 | B2 | 4/2013 | Jibu et al. |
| 8,427,259 | B2 | 4/2013 | Fujiwara et al. |
| 8,436,778 | B2 | 5/2013 | Fujiwara et al. |
| 8,476,991 | B2 | 7/2013 | Goto et al. |
| 8,482,184 | B2 | 7/2013 | Goto et al. |
| 8,482,363 | B2 | 7/2013 | Fujiwara et al. |
| 8,487,720 | B2 | 7/2013 | Fujiwara et al. |
| 8,531,252 | B2 | 9/2013 | Nakamura et al. |
| 8,564,172 | B2 | 10/2013 | Seki et al. |
| 8,576,025 | B2 | 11/2013 | Inoue et al. |
| 8,598,968 | B2 | 12/2013 | Seo et al. |
| 8,618,992 | B2 | 12/2013 | Fujiwara et al. |
| 8,669,832 | B2 | 3/2014 | Kamiguchi et al. |
| 8,686,809 | B2 | 4/2014 | Fujiwara et al. |
| 8,698,578 | B2 | 4/2014 | Nakanishi et al. |
| 8,704,612 | B2 | 4/2014 | Tsurunari et al. |
| 8,994,472 | B2 | 3/2015 | Yamaji et al. |
| 9,035,725 | B2 | 5/2015 | Komatsu et al. |
| 9,041,486 | B2 | 5/2015 | Tsurunari et al. |
| 9,048,813 | B2 | 6/2015 | Iwasaki et al. |
| 9,065,424 | B2 | 6/2015 | Nakanishi et al. |
| 9,083,314 | B2 | 7/2015 | Tsurunari et al. |
| 9,099,634 | B2 | 8/2015 | Inoue et al. |
| 9,118,302 | B2 | 8/2015 | Shimizu et al. |
| 9,124,240 | B2 | 9/2015 | Shimizu et al. |
| 9,136,458 | B2 | 9/2015 | Komatsu et al. |
| 9,166,558 | B2 | 10/2015 | Fujiwara et al. |
| 9,203,376 | B2 | 12/2015 | Tsurunari et al. |
| 9,203,378 | B2 | 12/2015 | Fujiwara et al. |
| 9,246,533 | B2 | 1/2016 | Fujiwara et al. |
| 9,294,071 | B2 | 3/2016 | Yamaji et al. |
| 9,413,330 | B2 | 8/2016 | Shimizu et al. |
| 9,419,584 | B2 | 8/2016 | Tsurunari et al. |
| 9,425,766 | B2 | 8/2016 | Fujiwara et al. |
| 9,467,117 | B2 | 10/2016 | Fujiwara et al. |
| 9,473,107 | B2 | 10/2016 | Komatsu et al. |
| 9,496,846 | B2 | 11/2016 | Iwasaki et al. |
| 9,520,857 | B2 | 12/2016 | Fujiwara et al. |
| 9,614,495 | B2 | 4/2017 | Hamaoka et al. |
| 9,628,047 | B2 | 4/2017 | Miyanari et al. |
| 9,634,644 | B2 | 4/2017 | Iwasaki et al. |
| 9,640,750 | B2 | 5/2017 | Nakanishi et al. |
| 9,647,635 | B2 | 5/2017 | Nakamura et al. |
| 9,722,573 | B2 | 8/2017 | Fujiwara et al. |
| 9,722,576 | B2 | 8/2017 | Fujiwara et al. |
| 9,748,924 | B2 | 8/2017 | Komatsu et al. |
| 9,819,329 | B2 | 11/2017 | Tsurunari et al. |
| 10,044,340 | B2 | 8/2018 | Fujiwara et al. |
| 10,097,159 | B2 | 10/2018 | Komatsu et al. |
| 10,135,422 | B2 | 11/2018 | Goto et al. |
| 10,141,643 | B2 | 11/2018 | Fujiwara et al. |
| 10,284,171 | B2 | 5/2019 | Miyanari et al. |
| 10,305,445 | B2 | 5/2019 | Nakamura et al. |
| 10,305,448 | B2 | 5/2019 | Iwasaki et al. |
| 10,374,570 | B2 | 8/2019 | Iwasaki et al. |
| 10,389,326 | B2 | 8/2019 | Hamaoka et al. |
| 10,439,585 | B2 | 10/2019 | Iwasaki et al. |
| 10,476,482 | B2 | 11/2019 | Niwa et al. |
| 10,489,132 | B1 | 11/2019 | Bloomcamp et al. |
| 10,749,497 | B2 | 8/2020 | Tang et al. |
| 10,778,181 | B2 | 9/2020 | Goto et al. |
| 10,778,183 | B2 | 9/2020 | Ando et al. |
| 10,873,311 | B2 | 12/2020 | Ando et al. |
| 10,917,727 | B2 | 2/2021 | Littrell et al. |
| 11,025,220 | B2 | 6/2021 | Fukuhara et al. |
| 11,050,406 | B2 | 6/2021 | Maki et al. |
| 11,075,616 | B2 | 7/2021 | Ando et al. |
| 11,101,787 | B2 | 8/2021 | Ando et al. |
| 11,133,789 | B2 | 9/2021 | Maki et al. |
| 11,189,593 | B2 | 11/2021 | Toong et al. |
| 11,245,378 | B2 | 2/2022 | Tang et al. |
| 11,258,429 | B2 | 2/2022 | Ando et al. |
| 11,349,454 | B2 | 5/2022 | Shin et al. |
| 11,356,075 | B2 | 6/2022 | Kadota et al. |
| 11,368,137 | B2 | 6/2022 | Goto et al. |
| 11,387,808 | B2 | 7/2022 | Shin et al. |
| 11,424,732 | B2 | 8/2022 | Shin et al. |

(56) References Cited

U.S. PATENT DOCUMENTS

| | | |
|---|---|---|
| 11,616,487 B2 | 3/2023 | Nakamura et al. |
| 11,616,491 B2 | 3/2023 | Tang et al. |
| 11,621,690 B2 | 4/2023 | Fukuhara et al. |
| 11,664,780 B2 | 5/2023 | Goto et al. |
| 11,671,072 B2 | 6/2023 | Goto et al. |
| 11,677,377 B2 | 6/2023 | Goto et al. |
| 11,689,178 B2 | 6/2023 | Nakamura et al. |
| 11,722,122 B2 | 8/2023 | Goto et al. |
| 11,750,172 B2 | 9/2023 | Goto et al. |
| 11,750,174 B2 | 9/2023 | Ando et al. |
| 11,804,822 B2 | 10/2023 | Fukuhara et al. |
| 11,824,515 B2 | 11/2023 | Tang et al. |
| 11,863,156 B2 | 1/2024 | Iwasaki et al. |
| 11,876,501 B2 | 1/2024 | Fukuhara et al. |
| 11,881,837 B2 | 1/2024 | Caron et al. |
| 11,894,828 B2 | 2/2024 | Nakamura et al. |
| 11,909,377 B2 | 2/2024 | Caron et al. |
| 11,909,378 B2 | 2/2024 | Caron et al. |
| 11,916,533 B2 | 2/2024 | Kadota et al. |
| 11,923,822 B2 | 3/2024 | Maki et al. |
| 11,923,823 B2 | 3/2024 | Fukuhara et al. |
| 11,996,821 B2 | 5/2024 | Goto et al. |
| 2006/0164184 A1 | 7/2006 | Nakamura et al. |
| 2009/0067659 A1 | 3/2009 | Wang et al. |
| 2010/0156554 A1 | 6/2010 | Nakamura et al. |
| 2013/0026881 A1 | 1/2013 | Okamoto et al. |
| 2014/0291784 A1* | 10/2014 | Conklin ............... H04R 1/2807 257/416 |
| 2016/0226464 A1 | 8/2016 | Fujiwara et al. |
| 2018/0152169 A1 | 5/2018 | Goto et al. |
| 2018/0159494 A1 | 6/2018 | Goto et al. |
| 2019/0074819 A1 | 3/2019 | Goto et al. |
| 2019/0379347 A1 | 12/2019 | Goto et al. |
| 2020/0162053 A1 | 5/2020 | Goto et al. |
| 2021/0099152 A1 | 4/2021 | Goto et al. |
| 2021/0111694 A1 | 4/2021 | Goto et al. |
| 2021/0159876 A1 | 5/2021 | Maki et al. |
| 2021/0159883 A1 | 5/2021 | Kadota et al. |
| 2021/0281239 A1 | 9/2021 | Maki et al. |
| 2022/0246824 A1 | 8/2022 | Barsukou et al. |
| 2022/0255534 A1 | 8/2022 | Barsukou et al. |
| 2022/0271730 A1 | 8/2022 | Abbott et al. |
| 2022/0271733 A1 | 8/2022 | Abbott et al. |
| 2022/0271734 A1 | 8/2022 | Abbott et al. |
| 2022/0286105 A1 | 9/2022 | Goto et al. |
| 2022/0332568 A1 | 10/2022 | Barsukou et al. |
| 2022/0368311 A1 | 11/2022 | Shin et al. |
| 2022/0399867 A1 | 12/2022 | Goto et al. |
| 2022/0399871 A1 | 12/2022 | Goto et al. |
| 2022/0407496 A1 | 12/2022 | Hill et al. |
| 2022/0408185 A1 | 12/2022 | Barsukou et al. |
| 2022/0408195 A1 | 12/2022 | Barsukou et al. |
| 2023/0013597 A1 | 1/2023 | Goto et al. |
| 2023/0031568 A1 | 2/2023 | Tang et al. |
| 2023/0062981 A1 | 3/2023 | Fukuhara et al. |
| 2023/0066822 A1 | 3/2023 | Fukuhara et al. |
| 2023/0069327 A1 | 3/2023 | Fukuhara et al. |
| 2023/0094674 A1 | 3/2023 | Barsukou et al. |
| 2023/0099440 A1 | 3/2023 | Barsukou et al. |
| 2023/0104257 A1 | 4/2023 | Barsukou et al. |
| 2023/0105726 A1 | 4/2023 | Tang et al. |
| 2023/0105794 A1 | 4/2023 | Barsukou et al. |
| 2023/0107376 A1 | 4/2023 | Goto et al. |
| 2023/0110477 A1 | 4/2023 | Maki et al. |
| 2023/0111849 A1 | 4/2023 | Maki et al. |
| 2023/0112443 A1 | 4/2023 | Barsukou et al. |
| 2023/0112487 A1 | 4/2023 | Barsukou et al. |
| 2023/0112677 A1 | 4/2023 | Tang et al. |
| 2023/0179171 A1 | 6/2023 | Yasuda et al. |
| 2023/0188896 A1 | 6/2023 | Barsukou et al. |
| 2023/0208376 A1 | 6/2023 | Goto et al. |
| 2023/0208389 A1 | 6/2023 | Goto et al. |
| 2023/0216473 A1 | 7/2023 | Barsukou et al. |
| 2023/0216482 A1 | 7/2023 | Yasuda et al. |
| 2023/0216483 A1 | 7/2023 | Barsukou et al. |
| 2023/0216484 A1 | 7/2023 | Barsukou et al. |
| 2023/0283255 A1 | 9/2023 | Nakamura et al. |
| 2023/0283963 A1 | 9/2023 | Chen et al. |
| 2023/0303387 A1 | 9/2023 | Barsukou et al. |
| 2023/0308081 A1 | 9/2023 | Tang et al. |
| 2023/0312334 A1 | 10/2023 | Barsukou et al. |
| 2023/0318566 A1 | 10/2023 | Yasuda et al. |
| 2023/0319484 A1 | 10/2023 | Barsukou et al. |
| 2023/0336159 A1 | 10/2023 | Hiramatsu et al. |
| 2023/0343659 A1 | 10/2023 | Yasuda et al. |
| 2023/0345182 A1 | 10/2023 | Yasuda et al. |
| 2023/0361753 A1 | 11/2023 | Yasuda et al. |
| 2023/0370044 A1 | 11/2023 | Goto et al. |
| 2023/0378930 A1 | 11/2023 | Goto et al. |
| 2023/0396233 A1 | 12/2023 | Nakamura et al. |
| 2023/0396235 A1 | 12/2023 | Nakamura et al. |
| 2024/0063775 A1 | 2/2024 | Ando et al. |
| 2024/0098426 A1 | 3/2024 | Barsukou et al. |

* cited by examiner

COMPOSITED CARRIER FOR MICROPHONE PACKAGE

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/325,409, filed Mar. 30, 2022, titled "INTEGRATED DEVICE PACKAGE WITH OPENING IN CARRIER," U.S. Provisional Patent Application No. 63/325,414, filed Mar. 30, 2022, titled "COMPOSITED CARRIER FOR MICROPHONE PACKAGE," and U.S. Provisional Patent Application No. 63/325,433, filed Mar. 30, 2022, titled "PACKAGE WITH EMBEDDED INTEGRATED DEVICE DIE," are hereby incorporated by reference under 37 CFR 1.57 in their entirety.

BACKGROUND

Technical Field

The field relates to device packages, and in particular, to integrated device packages with a reduced thickness having a shielding layer.

Description of Related Technology

An integrated device package can include an electrical component, such as an integrated device die (e.g., microelectronicmechanical systems (MEMS) die or an application specific integrated circuit (ASIC)). The components are typically mounted on a package substrate or a carrier, such as a printed circuit board (PCB). The package can include a lid to cover the electrical component. In some applications, it can be desired to provide a thin profile package, so as to enable the package to fit within small form-factor electronic devices and systems.

SUMMARY

The innovations described in the claims each have several aspects, no single one of which is solely responsible for its desirable attributes. Without limiting the scope of the claims, some prominent features of this disclosure will now be briefly described.

In one aspect, an integrated device package is disclosed. The integrated device package can include a carrier having an opening extending at least partially through a thickness of the carrier, an electronic component at least partially disposed in the opening and mechanically and electrically coupled to the carrier, and a lid coupled to the carrier. The lid and the carrier at least partially define a cavity. The lid and the electronic component are spaced by a gap defining a back volume.

In one embodiment, the electronic component is a microelectronicmechanical systems die. The microelectronicmechanical systems die can be a piezo electric microelectronicmechanical systems microphone. The opening can include an acoustic cavity. The cavity can be filled with an inert gas. The microelectronicmechanical systems can be a sensor die.

In one embodiment, the opening includes a die mount portion and an acoustic cavity narrower than the die mount portion. The electronic component can be at least partially disposed in the die mount portion.

In one embodiment, the integrated device package further includes an application specific integrated circuit die mounted to the carrier and disposed between the carrier and the lid.

In one embodiment, the electronic component is wire bonded to the carrier.

In one embodiment, the carrier is a printed circuit board. The carrier can include a multilayer structure having a first layer and a second layer. The first layer can have a first coefficient of thermal expansion and the second layer can have a second coefficient of thermal expansion greater than the first coefficient of thermal expansion. The second coefficient of thermal expansion can be closer to a coefficient of thermal expansion of the electronic component than to the first coefficient of thermal expansion. The second layer can include ceramic or glass. An electrical resistance of the second layer can be greater than an electrical resistance of the first layer. The carrier can include a passive component at least partially disposed within the carrier.

In one aspect, a printed circuit board is disclosed. The printed circuit board a first portion having a first thickness, and a second portion having a second thickness thinner than the first thickness. The second portion including an acoustic cavity and a die mount portion configured to receive a piezo electric microelectronicmechanical systems microphone, the acoustic cavity having a width narrower than a width of the die mount portion.

In one embodiment, the printed circuit board includes a multilayer structure having a first layer and a second layer. The first layer can have a first coefficient of thermal expansion and the second layer can have a second coefficient of thermal expansion greater than the first coefficient of thermal expansion. The second coefficient of thermal expansion can be closer to a coefficient of thermal expansion of the piezo electric microelectronicmechanical systems microphone than to the first coefficient of thermal expansion.

In one embodiment, the printed circuit board includes a multilayer structure having a first layer and a second layer. An electrical resistance of the second layer can be greater than an electrical resistance of the first layer.

In one embodiment, a microphone package includes the printed circuit board, the piezo electric microelectronicmechanical systems microphone mounted to the second portion of the printed circuit board, and a lid coupled to the printed circuit board. The lid and the piezo electric microelectronicmechanical systems microphone spaced by a gap defining a back volume.

In one aspect, a wireless communication device is disclosed. The wireless communication device can include a microphone including a carrier having an opening extending at least partially through a thickness of the carrier, a piezoelectric microelectronicmechanical systems microphone die at least partially disposed in the opening and mechanically and electrically coupled to the carrier, and a lid coupled to the carrier. The lid and the piezoelectric microelectronicmechanical systems die microphone are spaced by a gap defining a back volume. The wireless communication device can include a radio frequency front end in communication with the microphone.

In one embodiment, the carrier is a printed circuit board that includes a multilayer structure having a first layer and a second layer. The first layer can have a first coefficient of thermal expansion and the second layer can have a second coefficient of thermal expansion greater than the first coefficient of thermal expansion. The second coefficient of thermal expansion can be closer to a coefficient of thermal expansion of the piezo electric microelectronicmechanical systems microphone than to the first coefficient of thermal expansion.

In one embodiment, the wireless communication device further includes a processor and a transceiver between the microphone and the radio frequency front end.

In one aspect, a microphone package is disclosed. The microphone package can include a carrier having a multilayer structure having a first layer and a second layer. The first layer at least partially defines a lower side of the carrier. An electrical resistance of the second layer is greater than an electrical resistance of the first layer. The microphone package can include an integrated device die having a piezoelectric microphone element. The integrated device die is mounted on an upper side of the carrier opposite the lower side. The microphone package can include a lid coupled to the carrier. The lid and the carrier at least partially define a cavity. The lid and the integrated device die are spaced by a gap defining a back volume.

In one embodiment, the carrier is a printed circuit board.

In one embodiment, the first layer has a first coefficient of thermal expansion and the second layer has a second coefficient of thermal expansion greater than the first coefficient of thermal expansion. The second coefficient of thermal expansion can be closer to a coefficient of thermal expansion of the integrated device die than to the first coefficient of thermal expansion.

In one embodiment, the second layer includes ceramic or glass.

In one embodiment, the carrier includes a passive component disposed at least partially within the carrier.

In one embodiment, the second layer defines the upper side of the carrier.

In one embodiment, the carrier further comprises a third layer that includes the same material as the first layer. The third layer can be positioned such that at least a portion of the second layer is disposed between the first and third layers. The integrated device die can be mounted on the third layer.

In one embodiment, the integrated device die is mounted on the second layer.

In one embodiment, the carrier has an opening that extends at least partially through a thickness of the carrier. The integrated device die can be at least partially disposed in the opening and mechanically and electrically coupled to the carrier.

In one embodiment, the integrated device die is a piezo electric microelectronicmechanical systems microphone. The opening can include an acoustic cavity.

In one embodiment, the microphone package further includes an application specific integrated circuit die mounted on the carrier and disposed between the carrier and the lid.

In one embodiment, a wireless communication device includes the microphone package, and a radio frequency front end in communication with the integrated device package.

In one aspect, an integrated device package is disclosed. The integrated device package can include a carrier having a multilayer structure having a first layer and a second layer. The first layer has a first coefficient of thermal expansion and the second layer has a second coefficient of thermal expansion greater than the first coefficient of thermal expansion. The first layer defines a lower side of the carrier. The integrated device package can include a microelectronicmechanical systems die mounted on an upper side of the carrier opposite the lower side. The second coefficient of thermal expansion is closer to a coefficient of thermal expansion of the microelectronicmechanical systems die than to the first coefficient of thermal expansion. The integrated device package can include a lid coupled to the carrier. The lid and the carrier at least partially define a cavity. The lid and the microelectronicmechanical systems die are spaced by a gap defining a back volume.

In one embodiment, the carrier is a printed circuit board, and the second layer includes ceramic or glass.

In one embodiment, the carrier includes a passive component disposed at least partially within the carrier.

In one embodiment, the microelectronicmechanical systems die is a piezo electric microelectronicmechanical systems microphone and the carrier includes an opening defining a die mount portion to which the microelectronicmechanical systems die is at least partially disposed and an acoustic cavity.

In one aspect, an integrated device package is disclosed. The integrated device package can include a carrier having a multilayer structure. The carrier includes a passive component disposed at least partially within the carrier. The integrated device package can include a microelectronicmechanical systems die mounted to an upper side of the carrier, and a lid coupled to the carrier. The lid and the carrier at least partially defining a cavity. The lid and the microelectronicmechanical systems die are spaced by a gap defining a back volume.

In one embodiment, the carrier is a printed circuit board. The carrier can include a first layer and a second layer. The first layer defining a lower side opposite the upper side. The first layer can have a first coefficient of thermal expansion and the second layer can have a second coefficient of thermal expansion greater than the first coefficient of thermal expansion. The second coefficient of thermal expansion can be closer to a coefficient of thermal expansion of the microelectronicmechanical systems die than to the first coefficient of thermal expansion. The passive component can be at least partially disposed within the second layer.

In one aspect, an integrated device package is disclosed. The integrated device package can include a printed circuit board, a microelectronicmechanical systems die at least partially disposed within the printed circuit board and electrically coupled to the printed circuit board, a filler material at least partially disposed between the microelectronicmechanical systems die and the printed circuit board, and a lid coupled to the printed circuit board. The lid and the carrier at least partially define a cavity. The lid and the microelectronicmechanical systems die are spaced by a gap defining a back volume.

In one embodiment, the microelectronicmechanical systems die is at least partially disposed within the printed circuit board such that a top side of the microelectronicmechanical systems die is flush with a top side of the printed circuit board. The microelectronicmechanical systems die can be electrically coupled to the printed circuit board by way of a conductive trace formed over the printed circuit board.

In one embodiment, the microelectronicmechanical systems die is a piezo electric microelectronicmechanical systems microphone.

In one embodiment, the printed circuit board has an opening that extends at least partially through a thickness of the printed circuit board. The opening can include a die mount portion and an acoustic cavity. The microelectronicmechanical systems die can be disposed in the die mount portion of the opening and mechanically fixed to the printed circuit board by the filler material.

In one embodiment, the integrated device package further includes an application specific integrated circuit die at least partially disposed within the printed circuit board.

In one embodiment, the printed circuit board includes a multilayer structure having a first layer and a second layer. The first layer can have a first coefficient of thermal expansion and the second layer can have a second coefficient of thermal expansion greater than the first coefficient of thermal expansion. The second coefficient of thermal expansion can be closer to a coefficient of thermal expansion of the microelectronicmechanical systems die than to the first coefficient of thermal expansion. The second layer can include ceramic or glass. An electrical resistance of the second layer can be greater than an electrical resistance of the first layer.

In one embodiment, the printed circuit board includes a passive component disposed at least partially within the carrier.

In one aspect, an integrated device package is disclosed. The integrated device package can include a printed circuit board, a microelectronicmechanical systems die at least partially disposed within the printed circuit board, and a lid coupled to the printed circuit board. The microelectronicmechanical systems die is electrically connected to the printed circuit board by way of a conductive trace at least partially formed on the printed circuit board. The lid and the carrier at least partially define a cavity. The lid and the microelectronicmechanical systems die are spaced by a gap defining a back volume.

In one embodiment, the microelectronicmechanical systems die is disposed at least partially within the printed circuit board such that a top side of the microelectronicmechanical systems die is flush with a top side of the printed circuit board. The conductive trace can be at least partially disposed on the top side of the microelectronicmechanical systems die.

In one embodiment, the integrated device package further includes a filler material at least partially disposed between the microelectronicmechanical systems die and the printed circuit board.

In one embodiment, the microelectronicmechanical systems die is a piezo electric microelectronicmechanical systems microphone.

In one embodiment, the printed circuit board has an opening that extends at least partially through a thickness of the printed circuit board. The opening can include a die mount portion and an acoustic cavity. The microelectronicmechanical systems die can be disposed in the die mount portion of the opening and mechanically.

In one embodiment, the integrated device package further includes an application specific integrated circuit die at least partially disposed within the printed circuit board, and a passive component at least partially disposed within the printed circuit board.

In one embodiment, the printed circuit board includes a multilayer structure having a first layer and a second layer. The first layer can have a first coefficient of thermal expansion and the second layer can have a second coefficient of thermal expansion greater than the first coefficient of thermal expansion. The second coefficient of thermal expansion can be closer to a coefficient of thermal expansion of the microelectronicmechanical systems die than to the first coefficient of thermal expansion. An electrical resistance of the second layer can be greater than an electrical resistance of the first layer.

In one aspect, a wireless communication device is disclosed. The wireless communication device can include a microphone including a printed circuit board, a piezoelectric microelectronicmechanical systems microphone die at least partially disposed within the printed circuit board and electrically coupled to the printed circuit board, and a lid coupled to the printed circuit board. The lid and the microelectronicmechanical systems die are spaced by a gap defining a back volume. The wireless communication device can include a radio frequency front end in communication with the microphone.

In one embodiment, the microphone further includes a filler material at least partially disposed between the piezoelectric microelectronicmechanical systems microphone die and the printed circuit board. The piezoelectric microelectronicmechanical systems microphone die can be disposed within the printed circuit board such that a top side of the piezoelectric microelectronicmechanical systems microphone die is flush with a top side of the printed circuit board. The piezoelectric microelectronicmechanical systems microphone die and the printed circuit board can be electrically connected by way of a conductive trace formed on portions of the printed circuit board and the microelectronicmechanical systems die.

The present disclosure relates to U.S. patent application Ser. No. 18/190,355, titled "INTEGRATED DEVICE PACKAGE WITH OPENING IN CARRIER," filed on even date herewith, and U.S. patent application Ser. No. 18/190,291, titled "PACKAGE WITH INTEGRATED DEVICE DIE AT LEAST DISPOSED WITHIN CARRIER," filed on Mar. 27, 2023, the entire disclosures of which are hereby incorporated by reference herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

With the miniaturization of electronic devices, there is a demand for reducing a size of integrated device packages used in the electronic devices. Various embodiments disclosed herein relate to packages (e.g., integrated device packages) with a reduced thickness or low profile. An integrated device package can include a one or more electronic components that are mounted on a carrier (e.g., a printed circuit board (PCB)). The electronic component of the integrated device package can include a microelectronicmechanical systems (MEMS) die. Some electronic components of the integrated device package can operate optimally with a back volume. Such electronic components can include a piezoelectric MEMS microphone (PMM). The PMM can operate with an improved sensitivity when there is more back volume as a relatively large back volume can contribute to improved performance. Also, reducing a thickness of the carrier negatively affect durability of the carrier. Thus, in conventional PMM packages, a choice between a thinner package for reduced size and a thicker package for greater back volume is dilemmatic.

Various embodiments disclosed herein enable integrated device packages to have a reduced size (thickness) without negatively affecting or while improving the performance of the MEMS die, such as a PMM, included therein. Various embodiments disclosed herein enable the MEMS die to improve performance without increasing the size of the integrated device package. The integrated device package can include a carrier, such as a PCB, to which the MEMS die can be mounted. The carrier can have an opening that extends at least partially though a thickness of the carrier, and the MEMS die can be at least partially disposed in the opening. A portion of the carrier that includes the opening can be referred to as a thinned portion of the carrier. In some embodiments, the carrier can have a multilayer structure that includes a first layer and a second layer. Materials of the first and second layers can be selected to enable the integrated device package to improve performance. For example, the first layer can include a conventional PCB material and the second layer can include a high resistive material, such as ceramic or glass. In some embodiments, the carrier can include a passive component disposed at least partially within the carrier (e.g., embedded therein). In some embodiments, the MEMS die can be at least partially embedded in the carrier. The MEMS die can be fixed in position by a resin, e.g., a low elasticity resin. The MEMS die can be electrically connected to the carrier by way of a trace formed on the carrier.

Figure 1:
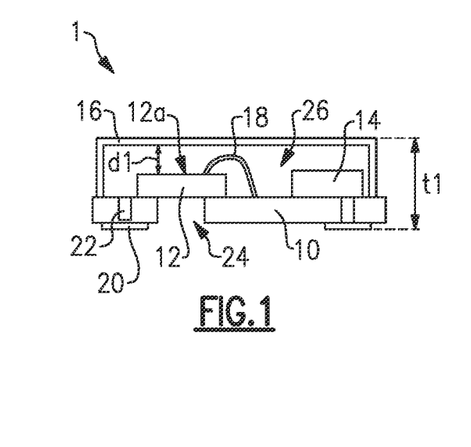
FIG. 1 is a schematic cross-sectional side view of an integrated device package.

FIG. 1 is a cross-sectional side view of an integrated device package 1. The integrated device package 1 includes a carrier 10, a first integrated device die (e.g., a sensor die 12) mounted on the carrier 10, and a second integrated device die (e.g., an application specific integrated circuit (ASIC) die 14) mounted on the carrier 10, and a lid 16 over the sensor die 12 and the ASIC die 14. In the illustrated embodiment, the sensor die 12 is a piezoelectric microelectronicmechanical systems microphone (PMM). The sensor die 12 is electrically connected to the carrier by way of a bond wire 18. The carrier 10 includes a terminal 20 for connecting the integrated device package 1 to an external device or to a larger substrate (not shown). The carrier 10 includes a via 22 to electrically connect portions of the integrated device package 1 vertically to the terminal 20. The carrier 10 includes an acoustic cavity 24. The carrier 10 and the lid 16 can together define a cavity 26 in which the sensor die 12 and the ASIC die 14 are disposed. A space in the cavity 26 between a top side 12a of the sensor die 12 and the lid 16 defines a back volume. Thus, a size of the back volume is dependent at least in part on a distance d1 between the top side 12a of the sensor die 12 and the lid 16. Generally, a greater distance d1 between the top side 12a of the sensor die 12 and the lid 16 can improve the performance of the sensor die 12 (e.g., the PMM).

In the integrated device package 1, when the distance d1 is increased, a thickness t1 will consequently increase, which is undesirable for use in a small device. Also, in the integrated device package 1, when the thickness t1 is reduced, the distance d1 will consequently decrease, which makes the performance of the PMM to be degraded. Further, in the integrated device package 1, when a thickness of the carrier 10 is reduced, the durability of the integrated device package 1 will be degraded.

Figure 2A:
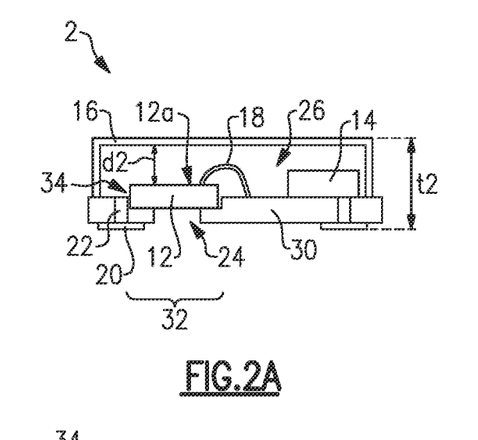
FIG. 2A is a schematic cross-sectional side view of an integrated device package according to an embodiment.
Figure 2B:
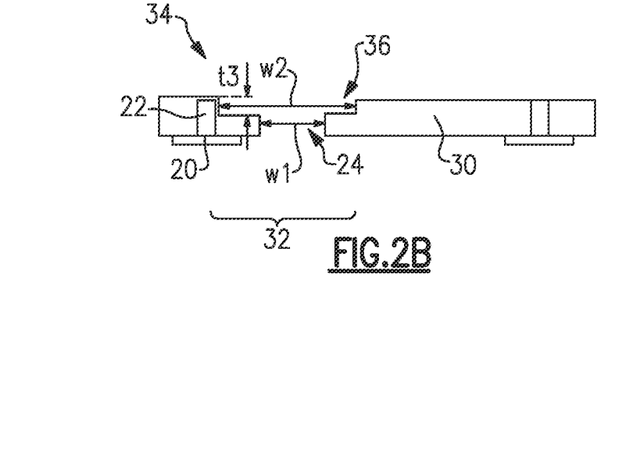
FIG. 2B shows a schematic cross-sectional view of a carrier of the integrated device package of FIG. 2A.

FIG. 2A is a schematic cross-sectional side view of an integrated device package 2 according to an embodiment. FIG. 2B shows a schematic cross-sectional view of a carrier 30 of the integrated device package 2. The integrated device package 2 can include the carrier 30, a first integrated device die (e.g., a sensor die 12) mounted to the carrier 30, and a second integrated device die (e.g., an application specific integrated circuit (ASIC) die 14) mounted to the carrier 30, and a lid 16 over the sensor die 12 and the ASIC die 14. The ASIC die 14 can, for example, analyze, process, and/or amplify signals received from the sensor die 12. The integrated device package 2 can include any number of electrical components mounted to the carrier 30.

In some embodiments, the carrier 30 can be a printed circuit board (PCB). The carrier 30 can include a terminal 20 for connecting the integrated device package 2 to an external device or to a larger substrate (not shown). The carrier 30 can include a via 22 to electrically connect portions of the integrated device package 2 vertically to the terminal 20. The carrier 30 can include conductive traces (not shown) disposed at least partially within the carrier 30 (e.g., embedded therein). For example, the conductive traces can at least partially provide a signal pathway between the sensor die 12 and the ASIC die 14. The PCB can be a polytetrafluoroethylene (PTFE) PCB, a prepreg, a ceramic PCB, a polyimide PCB, or any other materials traditionally implemented to manufacture a PCB.

The carrier 30 has a portion 32 that can include an opening 34 that extends at least partially though a thickness of the carrier 30. In some embodiments, the opening 34 can extend completely through the carrier 30. The opening 34 can include an acoustic cavity 24 and a die mount portion 36. The sensor die 12 can be at least partially disposed in the opening 34. The opening 34 can have a step structure that includes a width w1 of the acoustic cavity 24 different from a width w2 of the die mount portion 36. In the illustrated embodiment, the width w1 of the acoustic cavity 24 is narrower than the width w2 of the die mount portion 36. In some embodiments, the acoustic cavity 24 can be omitted.

The carrier 30 and the lid 16 can together define a cavity 26 in which the sensor die 12 and the ASIC die 14 are disposed. The cavity 26 can be filled with an inert gas, such as air. The lid 16 can be a metal lid, such as a steel lid. The lid 16 can be coupled to the carrier 30 in any suitable manner. In some embodiments, the lid 16 can be soldered on the carrier 30. The sensor die 12 can be an integrated device that includes a piezoelectric microphone element and the integrated device package 2 can be a microphone package. In the illustrated embodiment, the sensor die 12 is a piezoelectric microelectronicmechanical systems microphone (PMM). The PMM can pick up acoustic waves that enter through the acoustic cavity 24 of the carrier 30. The sensor die 12 can be electrically connected to the carrier by way of a bond wire 18. A space in the cavity 26 between a top side 12a of the sensor die 12 and the lid 16 defines a back volume. Thus, a size of the back volume can be dependent at least in part on a distance d2 between the top side 12a of the sensor die 12 and the lid 16. Generally, a greater distance d2 between the top side 12a of the sensor die 12 and the lid 16 can improve the performance or sensitivity of the sensor die 12 (e.g., the PMM). For example, the distance d2 can mitigate or prevent mechanical elements, such as a tip of a cantilever sensor, of the sensor die 12 to be in contact with the lid 16, particularly when a significantly high sound pressure is applied.

In the integrated device package 2, the die mount portion 36 of the opening 34 can enable the distance d2 to be increased without increasing a thickness t2 of the integrated device package 2 as compared to the thickness t1 of the integrated device package 1 shown in FIG. 1. For example, the distance d2 can be increased by a thickness t3 of the die mount portion 36 of the opening 34 relative to the distance d1 of the back volume of the integrated device package 1 (d2=d1+t3). Beneficially, the performance or sensitivity of the sensor die 12 can be improved in the integrated device package 2 without increasing the thickness t2. The thickness t3 of the die mount portion 36 of the opening 34 can be in a range between 1% and 100%, 20% and 80%, 20% and 50%, or 40% and 50% of the thickness of the carrier 30. In some embodiments, the thickness t3 of the die mount portion 36 of the opening 34 can be in a range between 0.1 mm and 1 mm, 0.2 mm and 1 mm, 0.4 mm and 1 mm, 0.1 mm and 0.8 mm, 0.1 mm and 0.6 mm, 0.2 mm and 0.8 mm, or 0.4 mm to 0.6 mm.

Figure 2C:
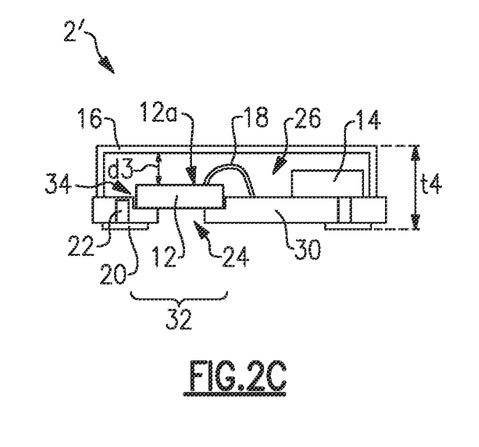
FIG. 2C is a schematic cross-sectional side view of an integrated device package according to another embodiment.

FIG. 2C is a schematic cross-sectional side view of the integrated device package 2'. The integrated device package 2' is generally similar to the integrated device package 2 shown in FIG. 2A except that the integrated device package 2' has a reduced thickness t4. Unless otherwise noted, components of FIG. 2C can be the same or generally similar to like components disclosed herein, such as those shown in FIGS. 2A and 2B.

In some embodiments, the performance or sensitivity of the sensor die 12 can be improved in the integrated device package 2' while reducing the thickness t4 relative to the thickness t1. For example, the thickness t4 can be reduced by an amount less than the thickness t3 of the die mount portion 36 of the opening 34, thereby improving the performance of the sensor die 12 while reducing the thickness t4. A height of the lid 16 and the thickness t3 can be controlled to achieve such benefits. In some embodiments, the thickness t4 can be reduced by the thickness t3 of the die mount portion 36 of the opening 34 thereby maintaining the performance of the sensor die 12 while reducing the thickness t4 relative to the thickness t1.

The thickness t3 of the die mount portion 36 of the opening 34 cam enable the top side 12a of the sensor die 12 to be closer to a surface of the carrier 30. Accordingly, the opening 34 can reduce the length of the bond wire 18. The opening 34 can enable formation of the bond wire 18 to be easier as compared to a carrier without the opening 34 (e.g., the carrier 10). The opening 34 can enable the sensor die 12 to be aligned in a target position on the carrier 30 more easily and accurately as compared to a carrier without the opening 34 (e.g., the carrier 10).

Figure 3A:
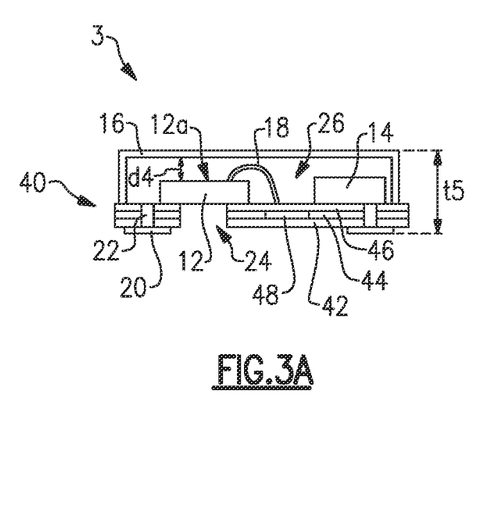
FIG. 3A is a schematic cross-sectional side view of an integrated device package according to another embodiment.

FIG. 3A is a schematic cross-sectional side view of an integrated device package 3 according to an embodiment. Unless otherwise noted, components of FIG. 3A can be the same or generally similar to like components disclosed herein, such as those shown in FIG. 2A to 2C. The integrated device package 3 can include a carrier 40, a first integrated device die (e.g., a sensor die 12) mounted to the carrier 30, and a second integrated device die (e.g., an application specific integrated circuit (ASIC) die 14) mounted to the carrier 30, and a lid 16 over the sensor die 12 and the ASIC die 14.

The carrier 40 can be a PCB. The carrier 40 has a multilayer structure. The carrier 40 can include that includes a first layer 42, a second layer 44, and a third layer 46. For example, the passive component 48 can be formed in the second layer 44. The first layer 42 and the third layer 46 can include the same material, and the second layer 44 can include a different material from the first and third layers 42, 46. In some embodiments, the first layer 42 has a first coefficient of thermal expansion and the second layer 44 has a second coefficient of thermal expansion that is greater than the first coefficient of thermal expansion. The second coefficient of thermal expansion can be closer to a coefficient of thermal expansion of the sensor die 12 than to the first coefficient of thermal expansion. For example, the first coefficient of thermal expansion can be in a range between 2 ppm and 7 ppm, and the second coefficient of thermal expansion can be in a range between 0.2 ppm and 0.4 ppm. In some embodiments, the second layer 44 can be a ceramic or glass layer. For example, the first and third layers 42, 46 can be resin layers (e.g., PTFE layers) and the second layer 44 be ceramic or glass layer. By having the second layer 44, a coefficient of thermal expansion mismatch between the sensor die 12 and the carrier 40 can be reduced. The reduced coefficient of thermal expansion mismatch between the sensor die 12 and the carrier 40 can prevent or mitigate delamination of the sensor die 12 from the carrier 40.

The first layer 42 has a first electrical resistance and the second layer 44 has a second electrical resistance. In some embodiments, the second electrical resistance can be greater than the first electrical resistance. In some embodiments, the second layer 44 can be a ceramic or glass layer. For example, the first and third layers 42, 46 can be resin layers (e.g., PTFE layers) and the second layer 44 be ceramic or glass layer. By having the second layer 44, overall resistance of the carrier 40 can be improved (increased). The improved resistance can reduce current or signal leakage in the carrier 40.

The second layer 44 can be more durable than the first layer 42 and/or the third layer 46. By having the second layer 44, durability of the carrier 40 can be improved. In some embodiments, the second layer 44 can be a ceramic or glass layer. For example, the first and third layers 42, 46 can be resin layers (e.g., PTFE layers) and the second layer 44 be ceramic or glass layer. The improved durability can enable the carrier 40 to be thinner thereby reducing a thickness t5 of the integrated device package 3 and/or increasing a distance d4 between the top side 12a of the sensor die 12 and the lid 16.

The carrier 40 can include a passive component 48 disposed at least partially within the carrier 40 (e.g., embedded therein). A signal transmitted from the sensor die 12 through the bond wire 18 can be routed to the ASIC die 14 at least partially through the passive component 48. Including the passive component 48 in the carrier 40 can enable simpler and easier electrical routing from the sensor die 12 to the ASIC die 14 as opposed to having the passive component 48 in another location, such as on the carrier 40. Including the passive component 48 in the carrier 40 can reduce current leakage and/or improve thermal dissipation.

Figure 3B:
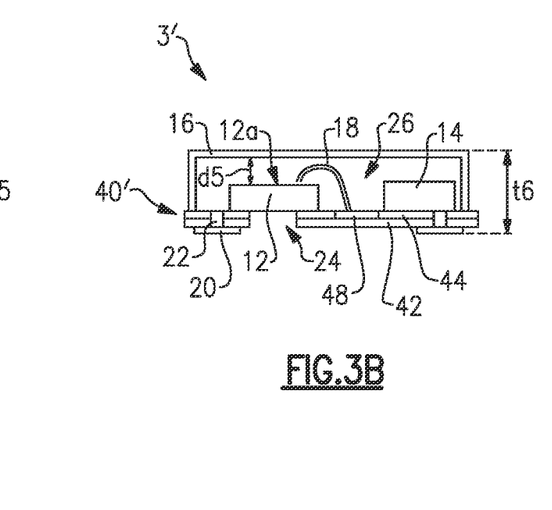
FIG. 3B is a schematic cross-sectional side view of an integrated device package according to another embodiment.

FIG. 3B is a schematic cross-sectional side view of an integrated device package 3' according to an embodiment. The integrated device package 3' is generally similar to the integrated device package 3 shown in FIG. 3A except that a carrier 40' of the integrated device package 3' does not include the third layer 46. Unless otherwise noted, components of FIG. 3B can be the same or generally similar to like components disclosed herein, such as those shown in FIG. 2A to 3A.

As the third layer 46 is omitted in the integrated device package 3', a thickness t6 of the integrated device package 3' can be reduced relative to the integrated device package 3 shown in FIG. 3A and/or a distance d5 between the top side 12a of the sensor die 12 and the lid in the integrated device package 3' can be greater than the distance d4 in the integrated device package 3 shown in FIG. 3A.

In some embodiments, the second layer 44 that defines an upper side of the carrier 40' can have a higher coefficient of thermal expansion than the first layer 42 so as to dissipate heat from the ASIC die 14 more efficiently than having a layer having a lower coefficient of thermal expansion for mounding the ASIC die 14.

Principle and advantages disclosed herein can be combined in any suitable manner. For example, FIGS. 4A and 4B illustrate various combinations of the features of the carriers 30, 40, 40' of FIGS. 2A to 3B.

Figure 4A:
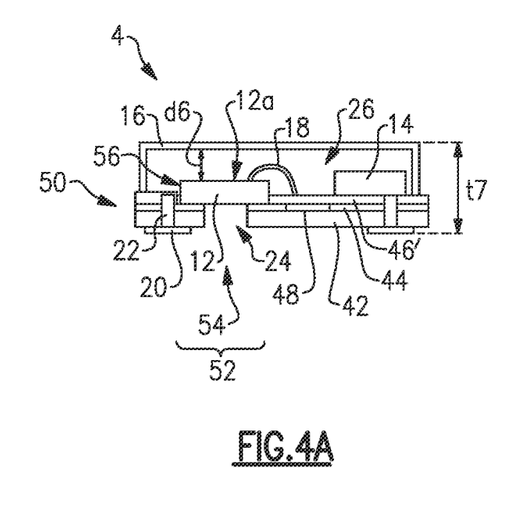
FIG. 4A is a schematic cross-sectional side view of an integrated device package according to another embodiment.

FIG. 4A is a schematic cross-sectional side view of an integrated device package 4 according to an embodiment. The integrated device package 4 is generally similar to the integrated device package 3 shown in FIG. 3A except that a carrier 50 of the integrated device package 4 includes a portion 52 similar to the portion 32 of the carrier 30 of FIGS. 2A to 2C. Unless otherwise noted, components of FIG. 4A can be the same or generally similar to like components disclosed herein, such as those shown in FIG. 2A to 3B.

The portion 52 of the carrier 40 can have an opening 54 that includes a die mount portion 56 and an acoustic cavity 24. The sensor die 12 can be at least partially disposed in the die mount portion 56. In the illustrated embodiment, the die mount portion 56 of the opening 54 extends completely through a thickness of the third layer 46' of the carrier 50. However, in some embodiments, the die mount portion 56 can partially extend through the thickness of the third layer 46'. The opening 54 can enable a distance d6 between the top side 12a of the sensor die 12 and the lid 16 to be greater as compared to the distance d4 in FIG. 3A, and/or a thickness t7 of the integrated device package 4 to be thinner as compared to the thickness t5 of the integrated device package 3.

Figure 4B:
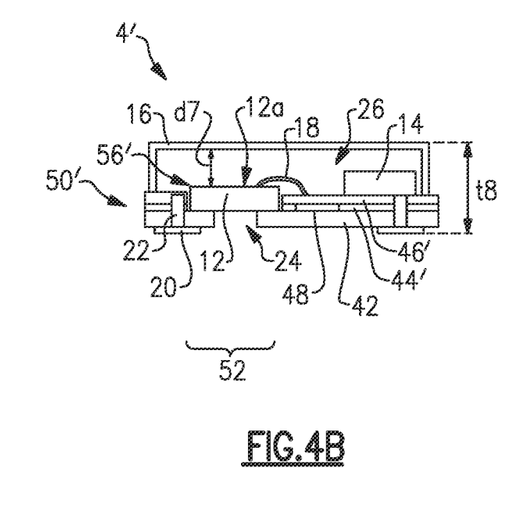
FIG. 4B is a schematic cross-sectional side view of an integrated device package according to another embodiment.

FIG. 4B is a schematic cross-sectional side view of an integrated device package 4' according to an embodiment. The integrated device package 4 is generally similar to the integrated device package 4 shown in FIG. 4A. Unless otherwise noted, components of FIG. 4B can be the same or generally similar to like components disclosed herein, such as those shown in FIG. 2A to 3B.

As illustrated in FIG. 4B, the die mount portion 56' of the opening 54 extends completely through a thickness of the third layer 46' and a thickness of the second layer 44' of the carrier 50. However, in some embodiments, the die mount portion 56 can partially extend through the thickness of the second layer 44'. The opening 54 can enable a distance d7 between the top side 12a of the sensor die 12 and the lid 16 to be greater as compared to the distance d4 in FIG. 3A, and/or a thickness t8 of the integrated device package 4' to be thinner as compared to the thickness t5 of the integrated device package 3.

Figure 5:
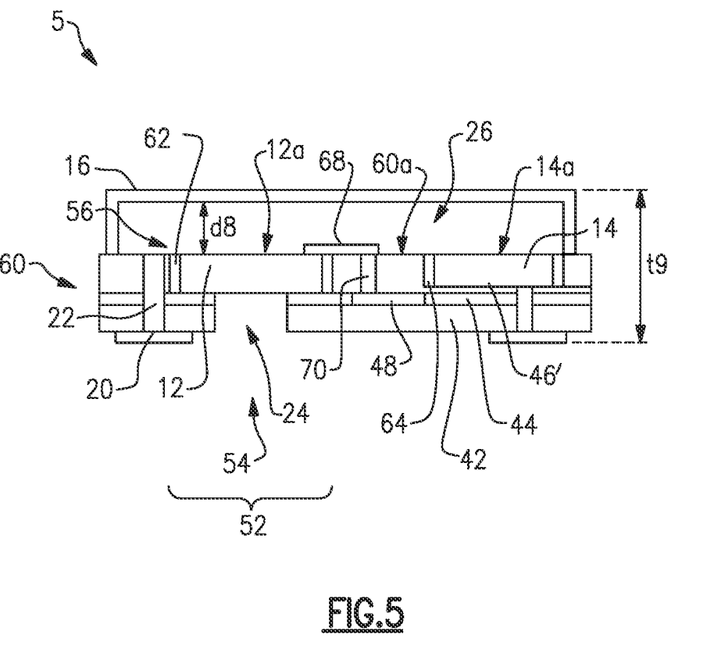
FIG. 5 is a schematic cross-sectional side view of an integrated device package according to another embodiment.

FIG. 5 is a schematic cross-sectional side view of an integrated device package 5 according to an embodiment. Unless otherwise noted, components of FIG. 5 can be the same or generally similar to like components disclosed herein, such as those shown in FIG. 2A to 4B. The integrated device package 5 can include a carrier 60, a first integrated device die (e.g., a sensor die 12) mounted to the carrier 60, and a second integrated device die (e.g., an application specific integrated circuit (ASIC) die 14) mounted to the carrier 60, and a lid 16 over the sensor die 12 and the ASIC die 14. The carrier 60 can be generally similar to the carrier 50 shown in FIG. 4A. However, any suitable carrier disclosed herein can be implemented in the integrated device package 5.

The sensor die 12 and the ASIC 14 can be at least partially embedded in the carrier 60. For example, as illustrate in FIG. 5, the sensor die 12 and the ASIC die 14 can be embedded such that a top side 12a of the sensor die 12 and/or a top side 14a of the ASIC die 14 are flush with a top side 60a of the carrier 60. A filler material 62 can be disposed between the sensor die 12 and the carrier 60, and a filler material 64 can be disposed between the ASIC die 14 and the carrier 60. The filler materials 62, 64 can maintain the positions of the sensor die 12 and the ASIC die 14. A relatively low elasticity resin can be used as the filler materials 62, 64 so as to release a chip stress to the sensor die 12 and/or the ASIC die 14 due to, for example, the thermal expansion of the carrier 60.

The sensor die 12 can be electrically connected to the carrier 60 by way of a conductive line or trace 68 formed at least partially on the top side 60a of the carrier and the top side 12a of the sensor die 12. In some embodiments, the conductive trace 68 can be formed by way of screen printing or evaporation. The formation of the conductive trace 68 can be easier, simpler, and quicker than formation of a bond wire connection between the sensor die 12 and the carrier 60. The carrier 60 can include a via 70 that vertically connects the conductive trace 68 and a passive component 48 embedded in the carrier 60.

By embedding or at least partially disposing the sensor die 12 (and the ASIC die 14) in the carrier 60, a distance d8 between the top side 12a of the sensor die 12 and the lid 16 can be reduced without increasing a thickness t9 of the integrated device package 5, and/or reduce the thickness t9 of the integrated device package 5 without degrading the performance of the sensor die 12.

Figure 6:
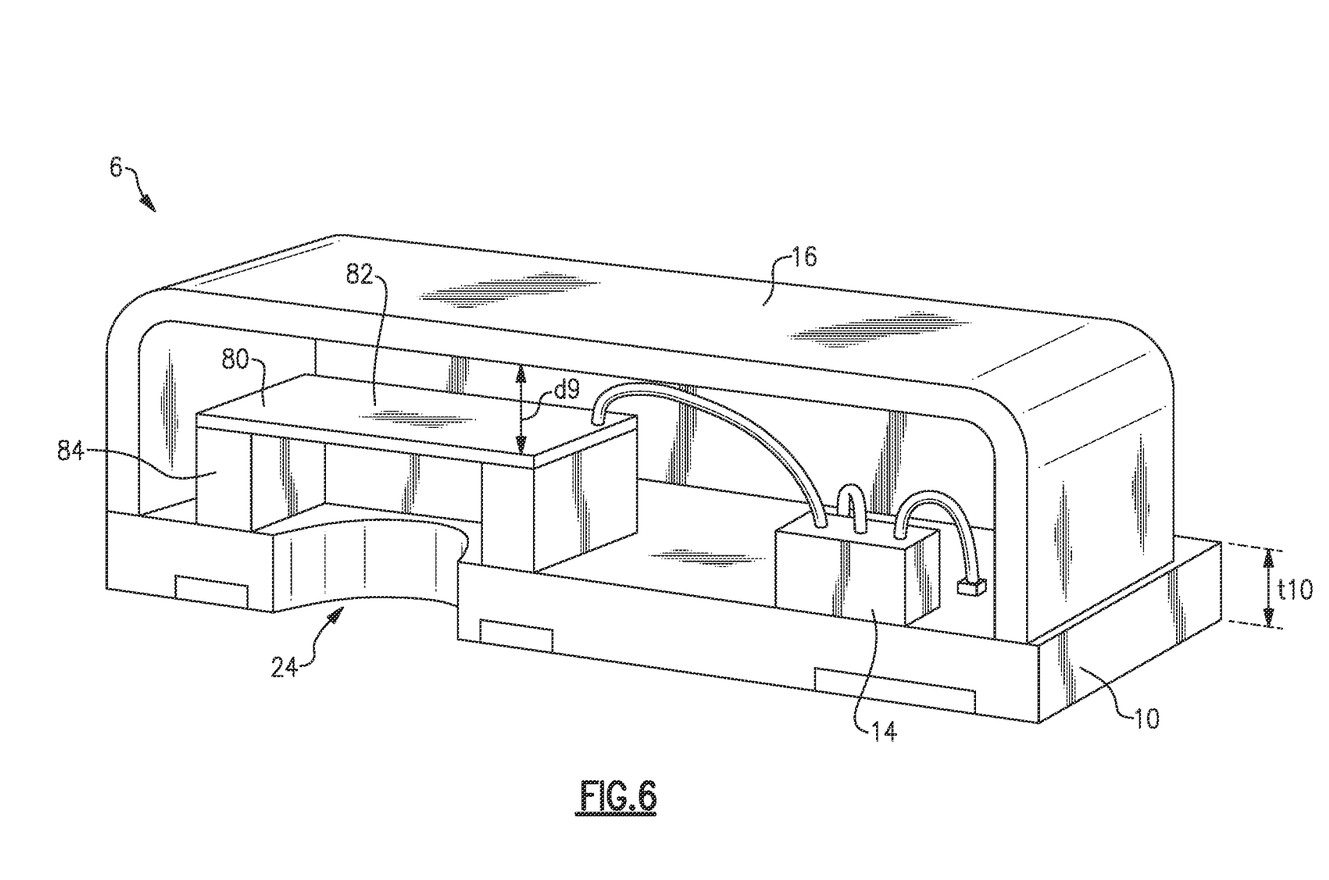
FIG. 6 is a schematic cross-sectional perspective view of an integrated device package.

FIG. 6 is a schematic cross-sectional perspective view of an integrated device package 6. The integrated device package 6 includes a carrier 10, a PMM 80 mounted to the carrier 10, an ASIC die 14 mounted to the carrier 10, and a lid 16 over the PMM 80 and the ASIC die 14. The carrier 10 includes an acoustic cavity 24. The PMM 80 includes a sensitive portion 82 that defines an upper side of the PMI 80, and a standoff structure 84 that supports the sensitive portion 82. The carrier 10 is a PCB. The carrier has a thickness t10. The integrated device package 6 includes a distance d9 from the sensitive portion 82 and the lid 16. the distance d9 can correlate to the back volume of the integrated device package 6.

Figure 7A:
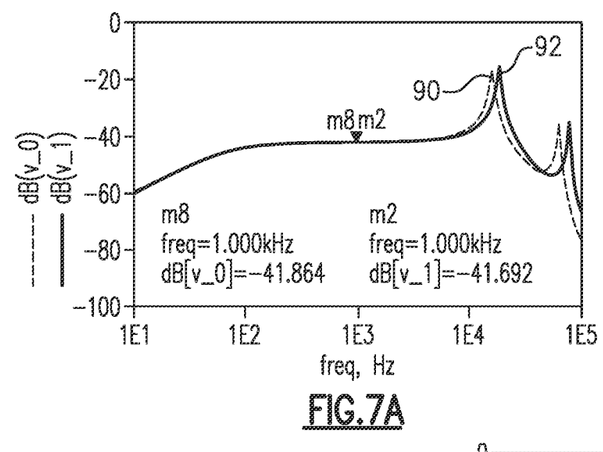
FIG. 7A shows simulated sensitivities of two different configurations of the integrated device package of FIG. 6.
Figure 7B:
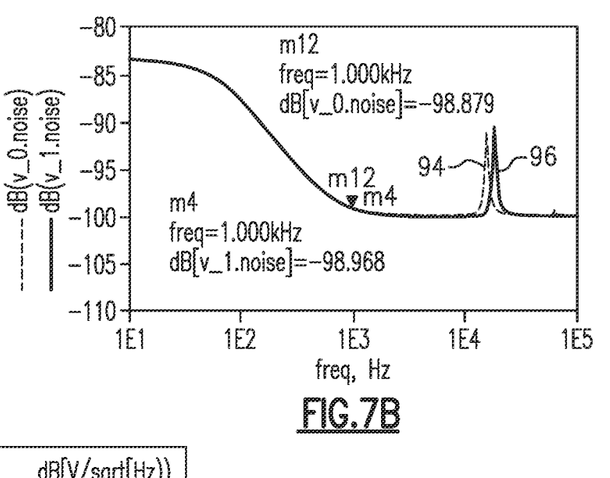
FIG. 7B shows simulated signal to noise ratios (SNRs) of the two different configurations of the integrated device package of FIG. 6.
Figure 7C:
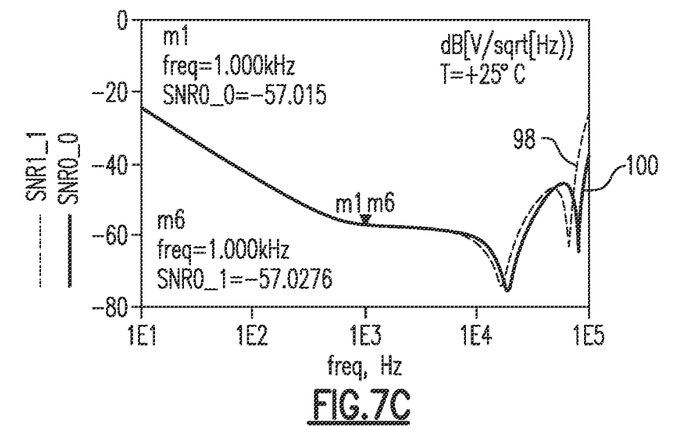
FIG. 7C shows simulated noise levels of the two different configurations of the integrated device package of FIG. 6.

FIGS. 7A-7C are graphs showing simulation results of the performance of the integrated device package 6 with different thicknesses t10 of the carrier 10. In the simulations, a 0.25 mm PCB and a 0.125 mm PCB are used as the carrier 10. Consequently, there is a 0.125 mm difference between the distances d9 in the integrated device package 6 used in the simulations. The graph in FIG. 7A shows simulated sensitivities 90, 92 of the integrated device package 6 with the 0.25 mm PCB and the 0.125 mm PCB respectively, the graph in FIG. 7B shows simulated signal to noise ratios (SNRs) 94, 96 (calculated by dividing the magnitude of the signal (S) by the magnitude of the noise (N)) of the integrated device package 6 with the 0.25 mm PCB and the 0.125 mm PCB respectively, and the graph in FIG. 7C shows simulated noise levels 98, 100 of the integrated device package 6 with the 0.25 mm PCB and the 0.125 mm PCB respectively.

The simulation results indicate that, with the greater back volume, the integrated device package 6 can improve the sensitivity (by about 0.2 dB), the SNR (by about 0.3 dB), and the noise level of the for the integrated device package 6. Accordingly, various embodiments of an integrated device package disclosed herein that increase the back volume can improve the sensitivity, the SNR, and the noise level of the for the integrated device package.

Figure 8:
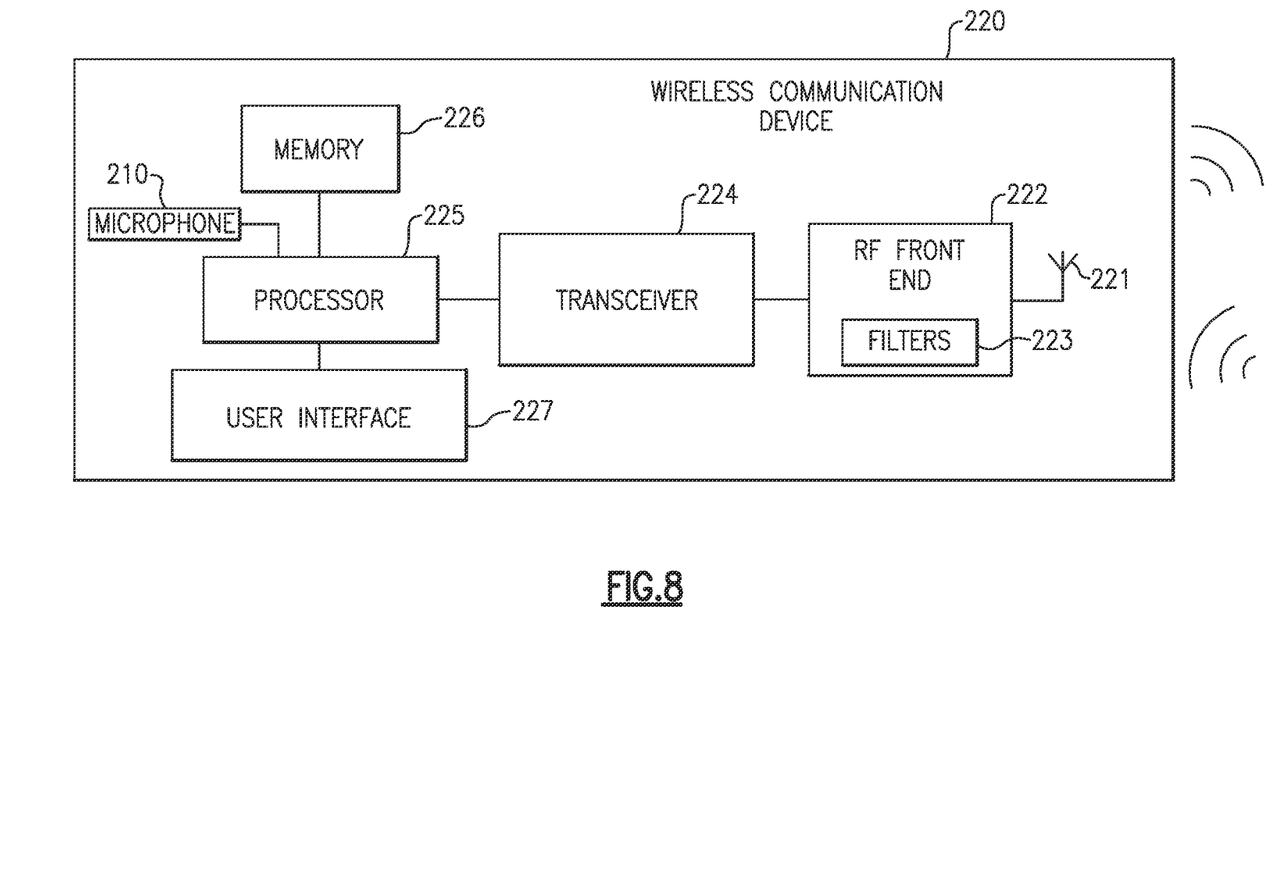
FIG. 8 is a schematic diagram of a wireless communication device.

FIG. 8 is a schematic diagram of a wireless communication device 220 that includes a microphone 210 packaged in accordance with any suitable principles and advantages discussed herein. In some embodiments, the microphone 210 can include one or more PMMs. As illustrated, the wireless communication device 220 includes the microphone 210, an antenna 221, a radio frequency (RF) front end 222, a transceiver 224, a processor 225, a memory 226, and a user interface 227. The wireless communication device 220 can include filters 223 in the RF front end 222. The filters 223 can include one or more SAW resonators. The wireless communication device 220 can be any suitable wireless communication device. For instance, a wireless communication device 220 can be a mobile phone, such as a smart phone. The antenna 221 can transmit/receive RF signals provided by the RF front end 222. Such RF signals can include carrier aggregation signals. Although not illustrated, the wireless communication device 220 can include a speaker in certain applications.

The RF front end 222 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 222 can transmit and receive RF signals associated with any suitable communication standards.

The transceiver 224 can provide RF signals to the RF front end 222 for amplification and/or other processing. The transceiver 224 can also process an RF signal provided by a low noise amplifier of the RF front end 222. The transceiver 224 is in communication with the processor 225. The processor 225 can be in communication with the microphone 210. The processor 225 can be a baseband processor. The processor 225 can provide any suitable base band processing functions for the wireless communication device 220. The memory 226 can be accessed by the processor 225. The memory 226 can store any suitable data for the wireless communication device 220. The user interface 227 can be any suitable user interface, such as a display with touch screen capabilities.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz. Acoustic wave resonators and/or filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. As used herein, the term "approximately" intends that the modified characteristic need not be absolute, but is close enough so as to achieve the advantages of the characteristic. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A microphone package comprising:
a carrier having a multilayer structure having a first layer and a second layer, the first layer at least partially defining a lower side of the carrier, an electrical resistance of the second layer being greater than an electrical resistance of the first layer, the first layer has a first coefficient of thermal expansion and the second layer has a second coefficient of thermal expansion greater than the first coefficient of thermal expansion;
an integrated device die having a piezoelectric microphone element, the integrated device die mounted on an upper side of the carrier opposite the lower side, the second coefficient of thermal expansion is closer to a coefficient of thermal expansion of the integrated device die than to the first coefficient of thermal expansion; and
a lid coupled to the carrier, the lid and the carrier at least partially defining a cavity, the lid and the integrated device die spaced by a gap defining a back volume.

2. The microphone package of claim 1 wherein the carrier is a printed circuit board.

3. The microphone package of claim 1 wherein the second layer includes ceramic or glass.

4. The microphone package of claim 1 wherein the carrier includes a passive component disposed at least partially within the carrier.

5. The microphone package of claim 1 wherein the second layer defines the upper side of the carrier.

6. The microphone package of claim 1 wherein the carrier further comprises a third layer that includes the same material as the first layer, the third layer is positioned such that at least a portion of the second layer is disposed between the first and third layers.

7. The microphone package of claim 6 wherein the integrated device die is mounted on the third layer.

8. The microphone package of claim 1 wherein the integrated device die is mounted on the second layer.

9. The microphone package of claim 1 wherein the carrier has an opening that extends at least partially through a thickness of the carrier, the integrated device die is at least partially disposed in the opening and mechanically and electrically coupled to the carrier.

10. The microphone package of claim 1 wherein the integrated device die is a piezo electric microelectronicmechanical systems microphone.

11. The microphone package of claim 9 wherein the opening includes an acoustic cavity.

12. The microphone package of claim 1 further comprising an application specific integrated circuit die mounted on the carrier and disposed between the carrier and the lid.

13. A wireless communication device comprising:
the microphone package of claim 1; and
a radio frequency front end in communication with the integrated device package.

14. An integrated device package comprising:
a carrier having a multilayer structure having a first layer and a second layer, the first layer having a first coefficient of thermal expansion and the second layer having a second coefficient of thermal expansion greater than the first coefficient of thermal expansion, the first layer defining a lower side of the carrier;
a microelectronicmechanical systems die mounted on an upper side of the carrier opposite the lower side, the second coefficient of thermal expansion is closer to a coefficient of thermal expansion of the microelectronicmechanical systems die than to the first coefficient of thermal expansion; and
a lid coupled to the carrier, the lid and the carrier at least partially defining a cavity, the lid and the microelectronicmechanical systems die spaced by a gap defining a back volume.

15. The integrated device package of claim 14 wherein the carrier is a printed circuit board, and the second layer includes ceramic or glass.

16. The integrated device package of claim 14 wherein the carrier includes a passive component disposed at least partially within the carrier.

17. The integrated device package of claim 14 wherein the microelectronicmechanical systems die is a piezo electric microelectronicmechanical systems microphone and the carrier includes an opening defining a die mount portion to which the microelectronicmechanical systems die is at least partially disposed and an acoustic cavity.

18. An integrated device package comprising:
a carrier that is a printed circuit board having a multilayer structure, the carrier includes a first layer and a second layer, the first layer defining a lower side opposite an upper side, the first layer has a first coefficient of thermal expansion and the second layer has a second coefficient of thermal expansion greater than the first coefficient of thermal expansion, the carrier including a passive component disposed at least partially within the second layer;

a microelectronicmechanical systems die mounted on the upper side of the carrier, the second coefficient of thermal expansion is closer to a coefficient of thermal expansion of the microelectronicmechanical systems die than to the first coefficient of thermal expansion; and a lid coupled to the carrier, the lid and the carrier at least partially defining a cavity, the lid and the microelectronicmechanical systems die spaced by a gap defining a back volume.

19. The integrated device package of claim 18 wherein the second layer defines the upper side of the carrier.

20. The integrated device package of claim 18 wherein the carrier further comprises a third layer that includes the same material as the first layer, the third layer is positioned such that at least a portion of the second layer is disposed between the first and third layers.

* * * * *